United States Patent [19]
Smith

[11] Patent Number: 5,452,409
[45] Date of Patent: Sep. 19, 1995

[54] SYSTEM AND METHOD FOR CREATING AND MODIFYING GRAPHS IN A COMPUTER SYSTEM USING A MULTIPLE SEGMENT GRAPH FORMAT

[75] Inventor: Jeffry H. Smith, Colorado Springs, Colo.

[73] Assignee: Hewlett-Packard Company, Palo Alto, Calif.

[21] Appl. No.: 101,345

[22] Filed: Aug. 2, 1993

Related U.S. Application Data

[63] Continuation of Ser. No. 757,890, Sep. 11, 1991, abandoned.

[51] Int. Cl.⁶ .............................................. G06T 11/00
[52] U.S. Cl. .................................. 395/140; 395/133; 395/135; 395/147
[58] Field of Search ........................... 395/140–143, 395/156, 160, 161, 50, 146, 147, 133, 134, 135; 364/578

[56] References Cited

U.S. PATENT DOCUMENTS

| | | | |
|---|---|---|---|
| 4,628,470 | 12/1986 | Baumann | 395/134 X |
| 4,800,510 | 1/1989 | Vinberg et al. | 395/140 |
| 4,965,743 | 10/1990 | Malin et al. | 395/50 |
| 5,121,470 | 6/1992 | Trautman | 395/140 |
| 5,142,618 | 8/1992 | Fujiwara et al. | 395/146 |
| 5,230,040 | 7/1993 | Yamashita | 395/140 X |

*Primary Examiner*—Almis R. Jankus

[57] ABSTRACT

A system and method for creating and maintaining graphs in a computer system. The computer system contains a windowing system. The present invention performs its functions without placing a great burden on computer system resources. According to the present invention, a graph is drawn on multiple forms. The graph is initially displayed on a display screen by writing the forms to the display screen. Each form stores a single data point of the graph. A new data point is added to the graph by representing the new data point in the appropriate form. To display the new data point on the display screen, only the modified form (that is, the form containing the new data point) is written to the display screen.

8 Claims, 9 Drawing Sheets

SYSTEM AND METHOD FOR CREATING AND MODIFYING GRAPHS IN A COMPUTER SYSTEM USING A MULTIPLE SEGMENT GRAPH FORMAT

CROSS RELATED APPLICATION

This is a continuation of application Ser. No. 07/757,890, filed on Sep. 11, 1991, now abandoned.

BACKGROUND OF THE INVENTION

1. Field of the Invention

The present invention relates generally to graph formats in computers, and more particularly to graph formats having multiple segments in computers having windowing systems.

2. Related Art

FIG. 1 illustrates a display image 102 associated with a computer system having a conventional windowing system. The computer image 102 may be either stored in a display memory or displayed on a display screen (or both). Included in the display image 102 are multiple windows 104. Each window contains one or more forms 106.

Each form 106 represents a rectangular area of pixels. A form 106 may be any size. Conventionally, forms 106 are considered to be indivisible elements by the windowing system. Consequently, whenever a screen update of a form is requested, the windowing system writes all of the pixels in the form to the display screen.

Conventionally, a graph is drawn on a single form (as illustrated by the form 106C). Adding a new point to the graph involves changing a few pixels in the form 106C. However, to display the new point on the display screen requires that all the pixels in the form 106C be written to the display screen, rather than just the pixels related to the new point.

Writing pixels to the display screen is very resource intensive. Thus, the conventional method for adding points to graphs represents a major burden on computer system resources. This is especially true in a real-time systems having Y-vs-time linegraphs.

SUMMARY OF THE INVENTION

The present invention is directed to a system and method for creating and maintaining graphs in a computer system. The computer system contains a windowing system. The present invention performs its functions without placing a great burden on computer system resources.

The present invention includes software functions for creating and maintaining graphs. According to the present invention, a graph is drawn on multiple forms. The graph is initially displayed on a display screen by writing the forms to the display screen. Each form stores a single data point of the graph. A new data point is added to the graph by representing the new data point in the appropriate form. To display the new data point on the display screen, only the modified form (that is, the form containing the new data point) is written to the display screen.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE DRAWINGS

The present invention will be described with reference to the accompanying drawings, wherein.

DETAILED DESCRIPTION OF THE PREFERRED EMBODIMENTS

1.0. General Operation and Structure

The present invention is described below with regard to Y-vs-time linegraphs. However, the present invention as described below is directly applicable to other types of graphs, such as scattergrams and bar charts.

Figure 1:
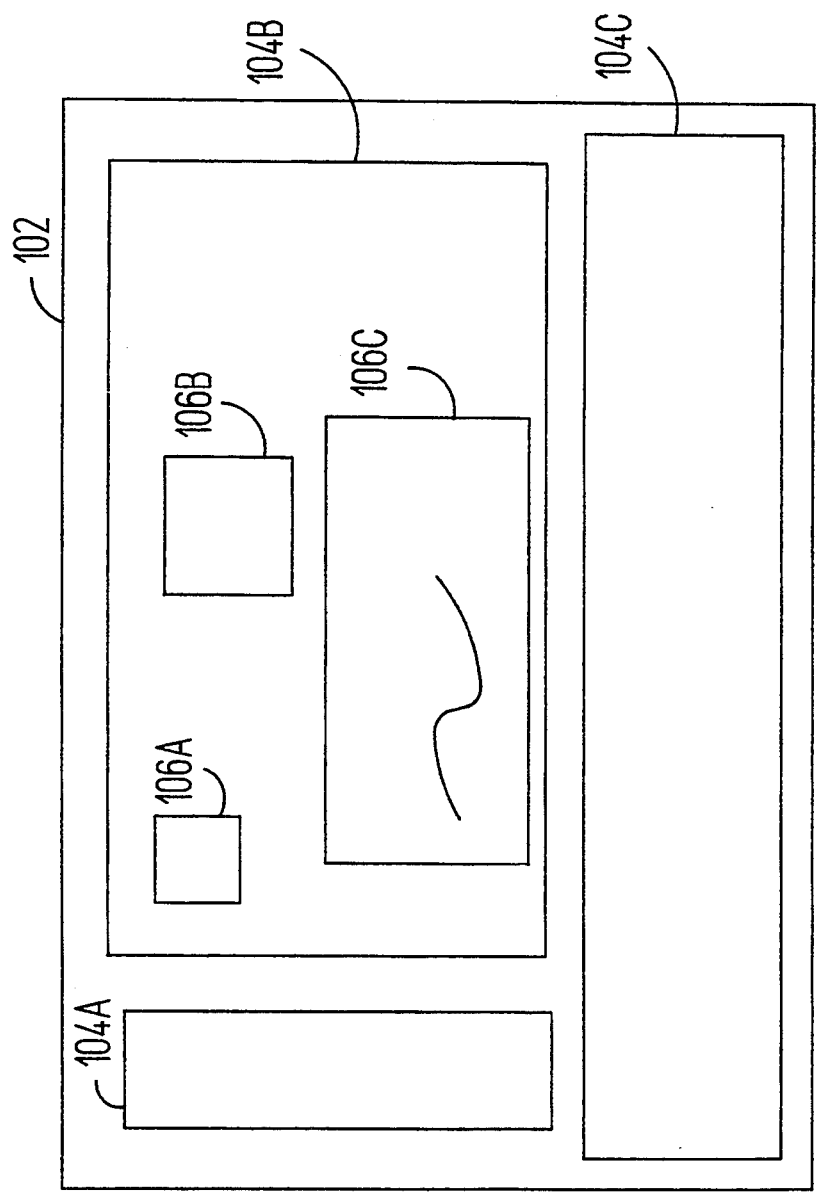
FIG. 1 illustrates a display image 102 associated with a computer system having a conventional windowing system.
Figure 2:
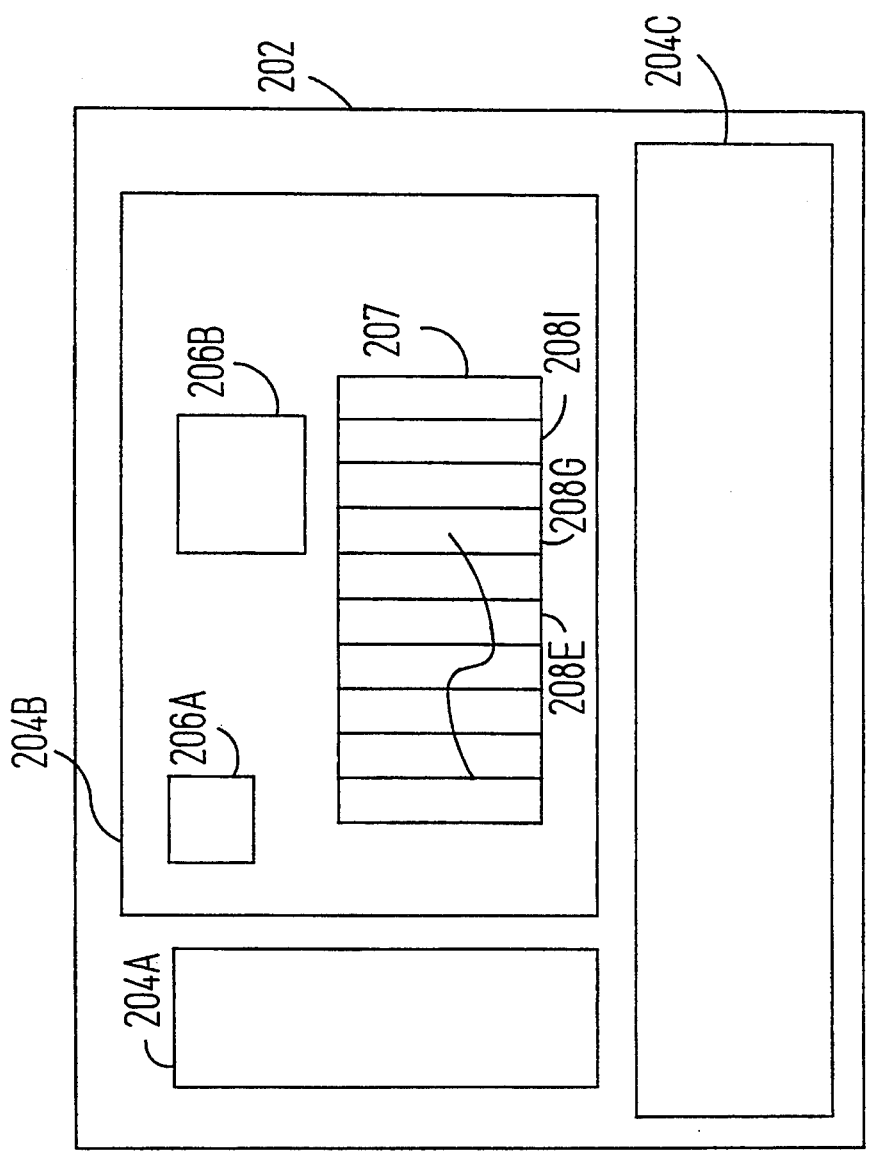
FIG. 2 illustrates a display image 202 according to the present invention associated with a computer system having a windowing system.

The general operation of the present invention shall be described with reference to FIG. 2. FIG. 2 illustrates a display image 202 associated with a computer system having a windowing system. The computer image 202 may be either stored in a display memory or displayed on a display screen (or both). Included in the display image 202 are multiple windows 204. Each window contains one or more forms 206, 208. The window 204B contains a linegraph 207.

According to the present invention, the linegraph 207 is not drawn on a single form. Rather, the linegraph 207 is drawn on multiple forms 208 (note that the edges of the individual forms 208 are not visible in the display screen). Adding a new point to the linegraph 207 involves changing a few pixels in the appropriate form 208G. Displaying the new point on the display screen requires that only the pixels in the changed form 208G be written to the display screen. Thus, the present invention conserves computer resources since it is not necessary to re-write all of the pixels associated with the linegraph 207.

Figure 3:
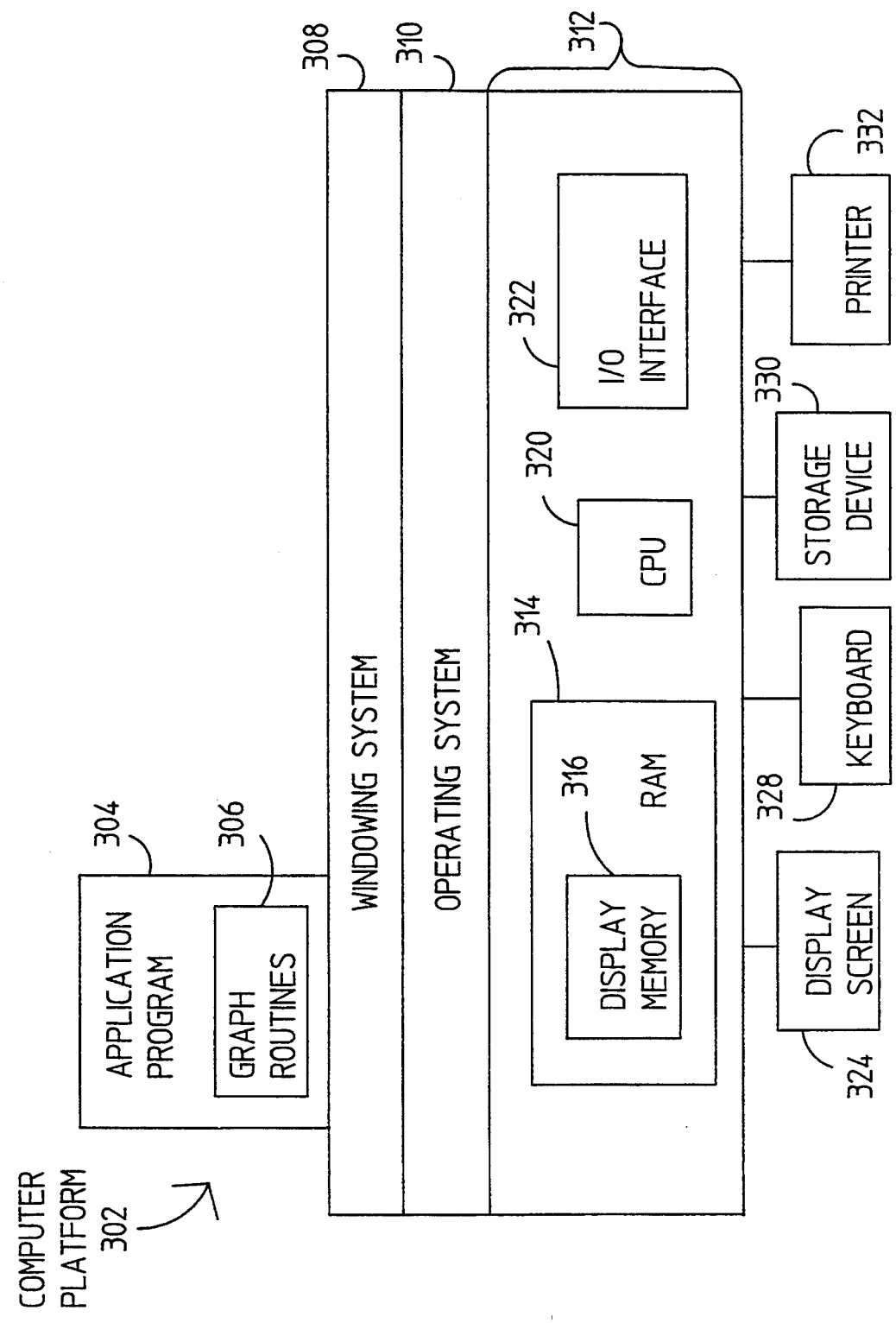
FIG. 3 illustrates a computing environment in which the present invention operates.

FIG. 3 illustrates the computing environment in which the present invention operates. The present invention operates on a computer platform 302 which has hardware components 312. The hardware components 312 include a random access memory (RAM) 314, a central processing unit 320, and an input/output (I/O) interface 322. The RAM 314 includes a display memory 316.

The computer platform 302 has an operating system 310 and a windowing system 308. Operating on the computer platform 302 is an application program 304.

The application program 304 includes graph routines 306. The graph routines 306 represent the present invention. The graph routines 306 may be part of a software library that has been linked into the application program 304.

The computer platform 302 includes various peripherals, such as a display screen 324, a keyboard 328, a storage device 330, and a printer 332.

In a preferred embodiment of the present invention, the computer platform is an International Business Machines (IBM) compatible personal computer. The windowing system is Smalltalk V. The present invention includes two components. First, a component to build a linegraph. Second, a component to display a data point on the linegraph. These two components are described in detail below.

2.0. Build Linegraph

Figure 4:
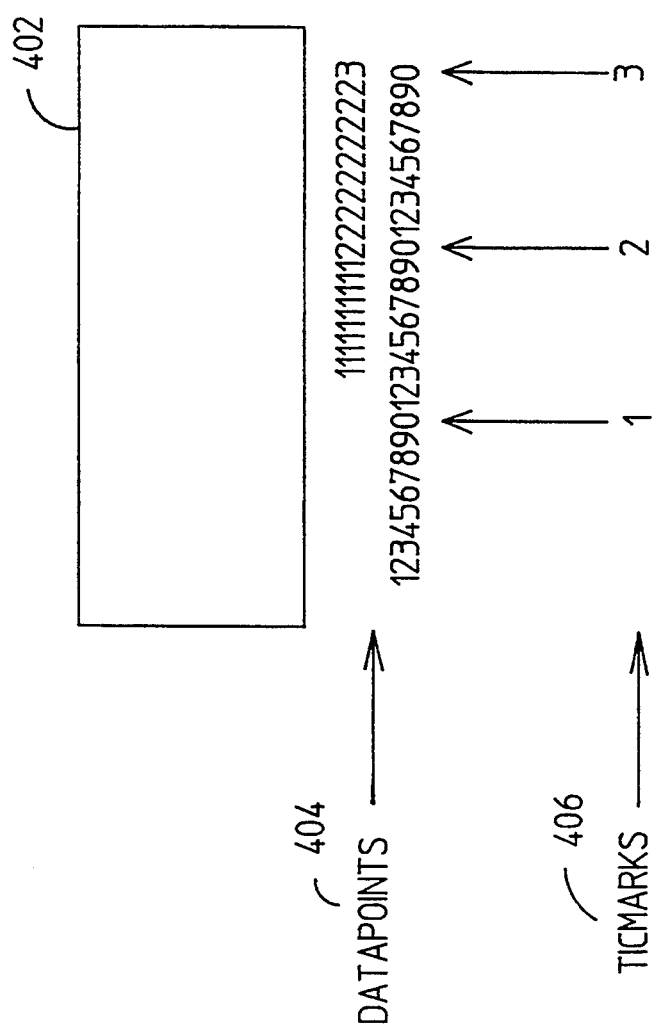
FIG. 4 illustrates a linegraph 402 which is created by a Build Linegraph method 602 of the present invention.
Figure 6:
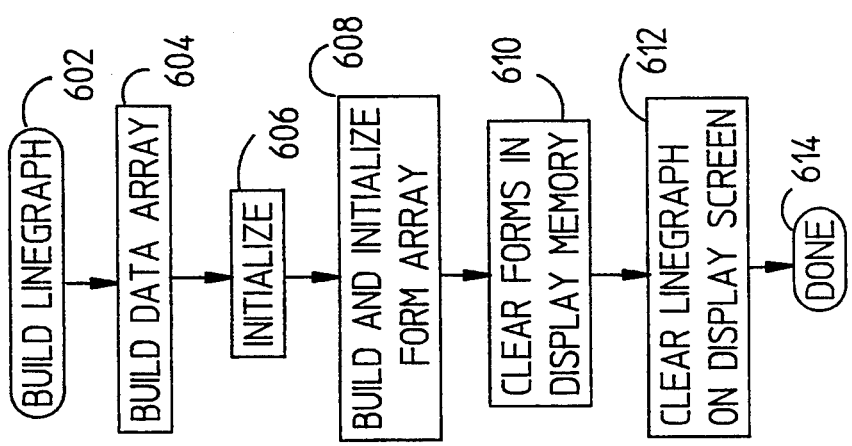
FIG. 6 illustrates a flowchart of the Build Linegraph method 602.

FIG. 6 illustrates a flowchart of a Build Linegraph method 602 of the present invention. FIG. 4 illustrates a linegraph 402 which is created by the Build Linegraph method 602.

The following variables must be specified to use the Build Linegraph method 602. First, ticmarks (T) 406 must be specified. T 406 equals the number of ticmarks along the horizontal axis of the linegraph 402. The ticmarks are not visible on the linegraph 402 (although the application program 304 may include separate code to show the ticmarks on a label for the horizontal axis).

Second, datapoints (P) 404 must be specified. P 404 equals the number of datapoints between each pair of ticmarks, including the datapoint at the ticmark.

The total number of datapoints which can be displayed by the linegraph 402 is equal to T times P.

The Build Linegraph method 602 of the present invention shall now be described. For illustrative purposes, assume in the following discussion that we are building a linegraph 402 with T=3 and P=10.

In step 604, an array of 1 . . . (T times P) integers is built. This array holds the values of the datapoints to be displayed. The values in the array are initialized to nil. This array is called DataArray.

In step 606, various local variables are initialized. Specifically, a DataIndex variable is initialized to 1. DataIndex indicates the lowest-numbered unused element of a FormArray and the DataArray (that is, where the next datapoint will be plotted). The FormArray is described below.

Also, a Range variable is initialized to 10. Range gives the vertical axis full-scale data value. Since Range is initialized to 10, the linegraph 402 can display data values between 0 and 10.

Also during step 606, the size of the linegraph 402 (in pixels) is retrieved using well known functions from the windowing system 308. X and Y values are retrieved, wherein X equals the horizontal width of the linegraph 402 and Y equals the vertical height of the linegraph 402.

Also during step 606, X is divided by (T times P). Qi is the integer part of the quotient and Qr is the remainder part of the quotient. In step 606, if Qi equals zero, then the Build Linegraph method 602 exits with an error because the width of the linegraph 402 (in pixels) would be less than the number of datapoints to be displayed.

In step 608, an array of 1 . . . (T times P) forms are built. The array is called FormArray. In the current example, FormArray holds 30 forms.

Each form is built using well known functions from the windowing system 308. These forms are used to display the datapoints in the linegraph 402. Each form contains the following information: bitmap, horizontal width, vertical width, horizontal offset, and vertical offset. A form's horizontal offset and vertical offset indicate the position of the form in a window relative to the linegraph's 402 upper lefthand corner.

Also in step 608, the forms in the FormArray are initialized with a horizontal width of Qi pixels and a vertical height of Y pixels. All of the vertical offsets are initialized to zero. The horizontal offset of the form in the first element of the FormArray is initialized to zero. The horizontal offset of the form in the second element of the FormArray is initialized to Qi. The horizontal offset of the third element of the FormArray is initialized to 2* Qi. The horizontal offset of the fourth element of the FormArray is initialized to 3* Qi. The horizontal offsets of the remaining elements of the FormArray are initialized in a similar manner.

Such initialization in step 608 creates a linegraph 402 having (T times P) forms whose sizes and shapes are identical. The forms have the same height as the linegraph 402. The forms are horizontally adjacent to each other. An area, on the display screen 324, which is Qr pixels wide will be unused at the right edge of the linegraph 402.

In step 610, all of the forms in the FormArray are cleared by initializing their pixels (in their bitmaps) to the background color of the linegraph 402.

In step 612, the area on the display screen 324 devoted to the linegraph 402 is cleared by displaying all of the cleared forms from the FormArray using well known functions from the windowing system 308.

3.0. Display Data Point

Figure 7:
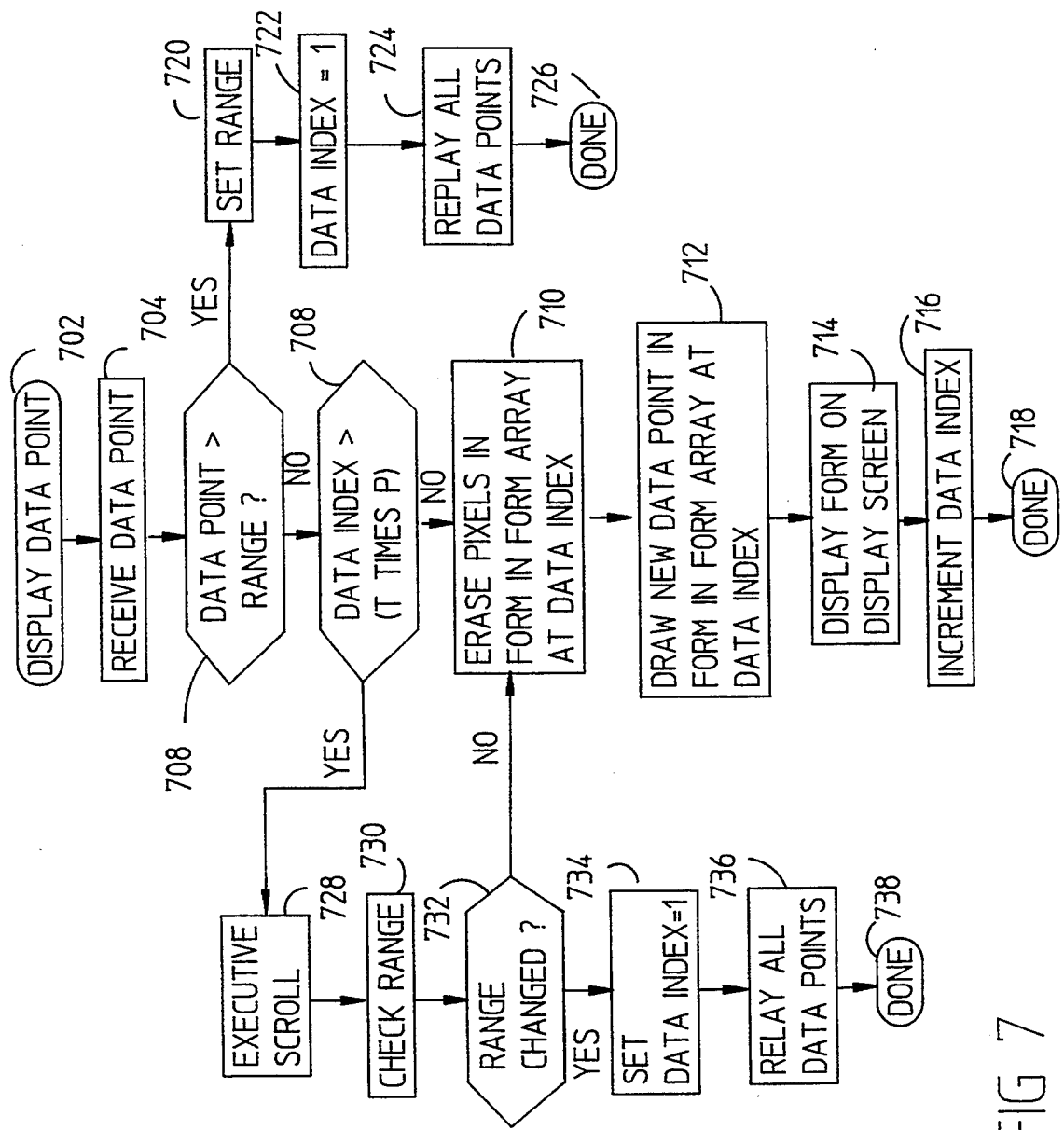
FIG. 7 illustrates a Display Data Point method 702 of the present invention.

FIG. 7 illustrates a Display Data Point method 702 of the present invention. The Display Data Point method 702 is described below.

In step 704, a new datapoint is received and stored into the DataArray at the element corresponding to DataIndex.

In step 706, it is determined whether the value of the datapoint is greater than the value of Range. If the value of the datapoint is greater, then steps 720, 722, 724, and 726 are performed.

In step 720, Range is set to a value which is greater than the value of the new datapoint. Usually, it is set to the lowest value in a 10, 20, 50, 100, 200, 500, 1000, 2000, . . . sequence which is greater than or equal to the new datapoint.

In step 722, DataIndex is set to 1.

In step 724, all the datapoints (including the newly received datapoint) in the linegraph 402 are redisplayed. In other words, the Display Data Point method 702 is performed for each of the datapoints in the linegraph 402. Following step 724, the Display Data Point method 702 is complete.

Steps 720, 722, 724, and 726 effectively redisplay all of the datapoints with the new Range as a scale factor. This is known as autoscaling because it ensures that none of the datapoints will be above the top of the linegraph 402.

If, in step 706, the value of the datapoint is not greater than Range, then step 708 is performed. In step 708, it is determined whether the value of DataIndex is greater than (T times P). If DataIndex is greater, then steps 728 through 738 are performed.

In step 728, a Scroll method 802 is performed. The Scroll method 802 is described in detail below.

In step 730, the integers in elements 1 through the element corresponding to (DataIndex-1) of the DataArray are examined to determine whether Range may be lowered. The value of Range is lowered if possible. Specifically, Range is set to the lowest value which is still greater than all of the datapoints. Usually, Range is set to a value in a 10, 20, 50, 100, 200, 500, 1000, 2000, . . . sequence.

In step 732, it is determined whether the value of Range was changed in step 730. If Range was changed, then steps 734, 736, and 738 are performed. Steps 734, 736, and 738 are similar in operation to steps 722, 724, and 726 (which are described above). Steps 734, 736, and 738 effectively redisplay all of the datapoints with a new Range as the scale factor. These steps are performed because a peak datapoint may have been discarded during the operation of the Scroll method 802.

If, in step 730, the value of Range was not changed, then in step 710 the pixels in the form in the formAray at element DataIndex are erased. The form is erased by setting all of its pixels to the background color of the linegraph.

In step 712, the new datapoint is drawn in the form which was erased above in step 710. It is drawn by coloring the pixel(s) whose vertical distance from the bottom of the form is the same ratio to the form's total height as the ratio of the value of the new datapoint is to Range. Any pixels below the pixels just colored are also colored. This creates a linegraph with a solid color fill between the datapoints being displayed and the horizontal axis. Numerous other types of displays (such as solid or dashed lines) are possible.

In step 714, web known functions from the windowing system 308 are used to cause the form corresponding to DataIndex to be displayed on the display screen. Displaying only a single form involves moving far fewer pixels to the display screen than would be necessary if the entire linegraph 402 were re-displayed on the display screen each time that a datapoint was added.

In step 716, the value of DataIndex is incremented by one.

4.0. Scroll

Figure 8:
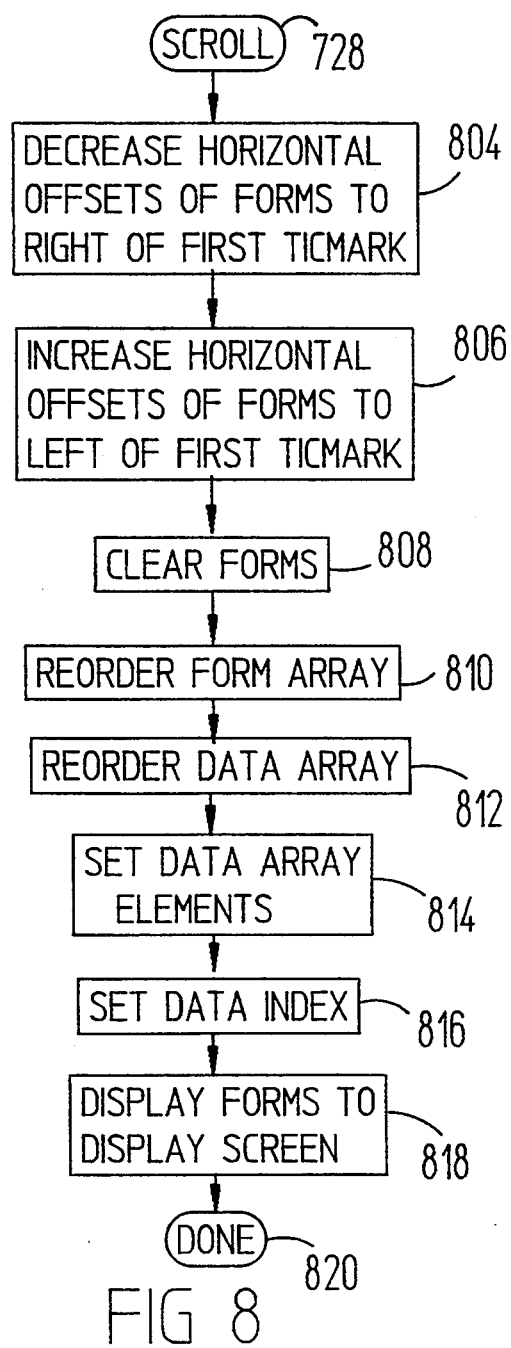
FIG. 8 illustrates a flowchart of a Scroll method 728 of the present invention.

FIG. 8 illustrates a flowchart of the Scroll method 728. The Scroll method 728 was briefly discussed above.

Figure 5A:
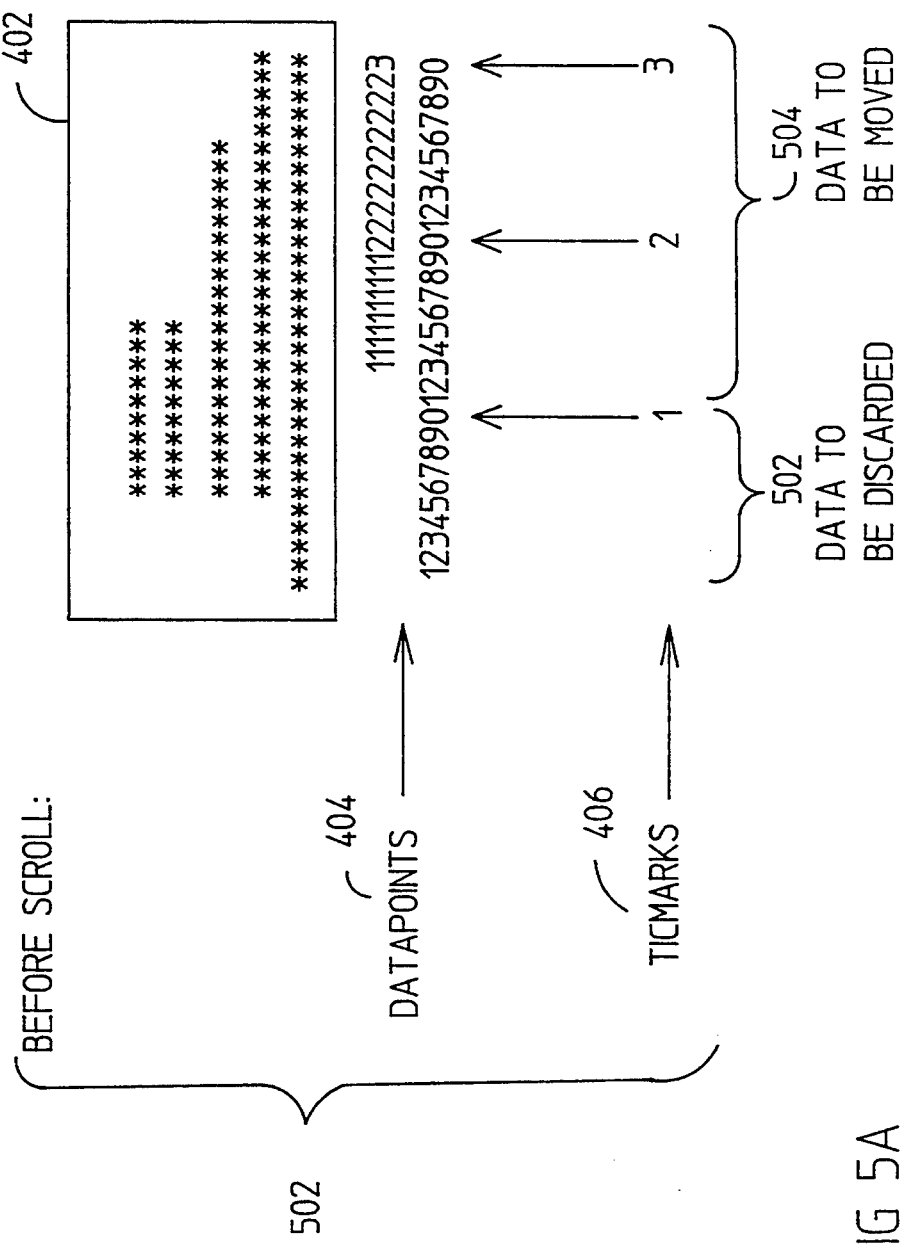
FIG. 5A illustrates a linegraph 402 before scrolling 502.
Figure 5B:
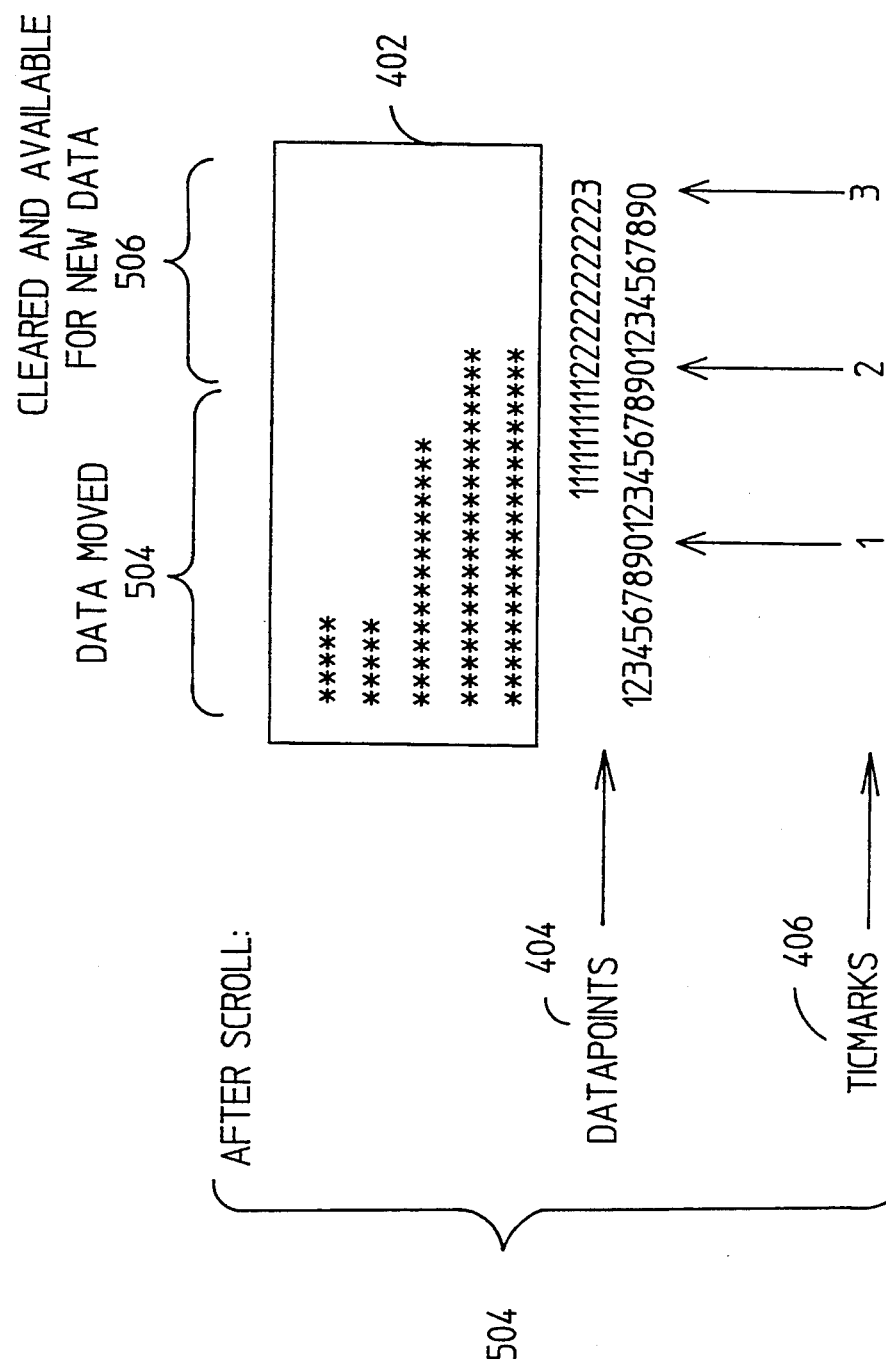
FIG. 5B illustrates the linegraph 402 after scrolling 504.

The Scroll method 728 is used to horizontally scroll the linegraph 402. The operation of the Scroll method 728 is generally described below with reference to FIGS. 5A and 5B. FIG. 5A illustrates a linegraph 402 before scrolling 502. FIG. 5B illustrates the linegraph 402 after scrolling 504. When the linegraph 402 is horizontally scrolled, the datapoints 502 frown the first ticmark to the origin of the linegraph 402 are discarded and all other datapoints 504 are moved to the left by the distance between the ticmarks. The datapoints 506 to the right of the next-to-highest ticmark are cleared. Note that the scrolled linegraph 402 contains historical information. Thus, the linegraph 402 may be used to graphically illustrate past and present information.

Conventionally, scrolling is expensive in terms of the amount of computer resources consumed. However, scrolling according to the present invention consumes less than 1/P of the computer resources (relative to conventional methods, wherein linegraphs are scrolled left by only one datapoint at a time). Additionally, some conventional scrolling methods first erase the linegraph and then plot the datapoints. However, such conventional methods retain no historical information.

Thus, the Scroll method 728 of the present invention is an improvement over conventional scrolling methods. The Scroll method 728 shall now be described in detail.

In step 804, the horizontal offsets of all forms to the right of the first ticmark are decreased by (P times Qi). This causes the forms to be displayed in a different part of the linegraph 402 the next time that they are re-displayed on the display screen 324. This does not alter the current display on the display screen 324. Referring to FIGS. 5A and 5B, for example, this causes the forms which currently display datapoints 11 . . . 30 to be moved to the positions 1 . . . 20.

In step 806, the horizontal offsets of all of the forms from the first ticmark to the left edge of the linegraph are increased by (P times (T−1) times Qi). Referring to FIGS. 5A and 5B, for example, this causes the forms which display datapoints 1 . . . 10 to be moved to the positions 21 . . . 30.

In step 808, all forms moved in step 806 are cleared. This is done by setting all of their pixels to the linegraph background color.

In step 810, the elements in the FormArray are reordered by removing and saving the first P elements. Then, the remaining elements are shifted toward the front of the FormArray by P spaces each. Then, the saved elements are placed (in order) at the end of the FormArray. This will place the forms in the FormArray in order of increasing horizontal offset.

In step 812, the DataArray is reordered in the same manner as described for the FormArray in step 810. This leaves each element of the DataArray in the same relative position as its corresponding form in the FormArray.

In step 814, the integer values of the last P elements in the DataArray are set to nil. These datapoints correspond to the erased forms 506.

In step 816, DataIndex is set to (P times (T−1)). This is the index of the leftmost cleared form and datapoint.

In step 818, well known functions from the windowing system 308 are used to display all of the forms on the display screen 324. This updates the display screen 324.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. In a computer system having a display screen and a windowing system, a method for displaying a graph on said display screen, said method comprising the steps of:

(a) drawing the graph on multiple forms wherein the graph comprises T ticmarks each having P data points, the graph having a plurality of data points, each form containing a single data point of the graph, wherein the step for drawing the graph on multiple forms comprises the steps of:

(1) building a data array of said data points;

(2) building a form array of said forms, wherein each of said forms contains a bitmap, a horizontal offset, and a vertical offset;

(3) initializing said horizontal and vertical offsets;

(4) initializing said bitmap for each of said forms;
(5) initializing an index to said data and forms array; and
(6) initializing a range;
(b) displaying said forms on the display screen;
(c) modifying one of said forms to modify the data point contained therein; and
(d) re-displaying only said modified form on the display screen thereby modifying the graph.

2. The method of claim 1, wherein said step for initializing said horizontal and vertical offsets comprises the steps of:
(1) determining a horizontal width of the graph in pixels;
(2) generating a Q by dividing said horizontal width by T times P;
(3) setting said horizontal offsets according to an equation:
(index−1)*Q.

3. The method of claim 2, wherein the step for modifying one of said forms to modify the graph comprises the steps of:
(1) receiving a new data point;
(2) storing said new data point in said data array according to said index;
(3) identifying one of said forms in said form array by using said index;
(4) erasing pixels associated with said identified form;
(5) modifying said pixels to represent said new data point; and
(6) incrementing said index.

4. The method of claim 3, further comprising the following steps after step (2):
(i) determining whether said new data point is greater than a range variable;
(ii) branching to step (3) if said new data point is not greater than said range variable;
(iii) setting said range variable to a value greater than said new data point;
(iv) initializing said index; and
(v) performing steps (1)–(6) for all of said forms.

5. The method of claim 3, further comprising the following steps after step (2):

(i) determining whether said index is greater than T*P;
(ii) branching to step (3) if said index is not greater than T*P;
(iii) scrolling the graph; and
(iv) branching to step (3).

6. The method of claim 5, wherein the step for scrolling the graph comprises the steps of:
decreasing by P times Q said horizontal offsets associated with said forms which are right of a first ticmark;
clearing said bitmaps associated with said forms which are left of said first ticmark;
increasing by P times (T−1) times Q said horizontal offsets associated with said forms which are left of said first ticmark;
reordering said form array such that said forms are ordered by increasing horizontal offset;
reordering said data array such that said data points are ordered relative to corresponding forms in said form array;
initializing the last P elements in said data array;
setting said index to P times (T−1); and
displaying said forms on the display screen.

7. The method of claim 1, wherein said step for initializing said bitmap for each of said forms comprises the step of setting pixels in said bitmap to a background color of the graph.

8. A computer system comprising:
(1) a display screen;
(2) a windowing system;
(3) means for displaying a graph on said display screen, said displaying means comprising:
(a) means for drawing said graph on multiple forms, the graph having a plurality of data points, each form containing a single data point of the graph;
(b) means for displaying said forms on said display screen;
(c) means for modifying one of said forms to modify the single data point contained therein; and
(d) means for re-displaying only said modified form on said display screen thereby modifying the graph.

* * * * *